(12) United States Patent
Takahashi et al.

(10) Patent No.: US 9,686,879 B2
(45) Date of Patent: Jun. 20, 2017

(54) ELECTRONIC DEVICE AND GLASS SEALING METHOD USED THEREFOR

(71) Applicant: KYOCERA CRYSTAL DEVICE CORPORATION, Yamagata (JP)

(72) Inventors: Kazuya Takahashi, Yamagata (JP); Katsuhiro Ogasawara, Yamagata (JP); Yoshinori Nasu, Yamagata (JP); Yukari Yahagi, Yamagata (JP); Osamu Eguchi, Yamagata (JP)

(73) Assignee: KYOCERA CRYSTAL DEVICE CORPORATION, Yamagata (JP)

( * ) Notice: Subject to any disclaimer, the term of this patent is extended or adjusted under 35 U.S.C. 154(b) by 585 days.

(21) Appl. No.: 14/072,860

(22) Filed: Nov. 6, 2013

(65) Prior Publication Data

US 2014/0240905 A1   Aug. 28, 2014

(30) Foreign Application Priority Data

Feb. 25, 2013  (JP) ................................ 2013-034464
May 14, 2013  (JP) ................................ 2013-102485

(51) Int. Cl.
*H05K 5/06* (2006.01)
*H04M 1/02* (2006.01)

(52) U.S. Cl.
CPC .... *H05K 5/062* (2013.01); *H01L 2224/16225* (2013.01); *H04M 1/0202* (2013.01)

(58) Field of Classification Search
CPC ....... H01L 2224/16225; H04M 1/0202; H05K 5/062

USPC ..... 65/43, 59.1, 42, 155, 154; 428/1.1, 1.32, 428/1.51; 156/99, 107, 104, 103

See application file for complete search history.

(56) References Cited

U.S. PATENT DOCUMENTS

| | | | | |
|---|---|---|---|---|
| 4,071,658 | A * | 1/1978 | Phillips | B22F 7/08 428/552 |
| 4,104,427 | A * | 8/1978 | Nolte | B32B 17/10311 156/99 |
| 5,407,119 | A * | 4/1995 | Churchill | B23K 1/0056 219/121.64 |
| 5,443,912 | A * | 8/1995 | Olson | B32B 17/10064 156/108 |
| 5,506,057 | A * | 4/1996 | Olson | B32B 17/10 156/102 |
| 6,606,772 | B1 * | 8/2003 | Nohara | H03H 3/02 29/25.35 |
| 6,809,412 | B1 * | 10/2004 | Tourino | B81B 7/007 257/678 |

(Continued)

FOREIGN PATENT DOCUMENTS

JP      3811423        8/2006
WO   WO 2012172866 A1 * 12/2012 ............... H05K 5/61

*Primary Examiner* — Jodi D Franklin
(74) *Attorney, Agent, or Firm* — Greenblum & Bernstein, P.L.C.

(57) ABSTRACT

An electronic device and a glass sealing method used therefor, with which a sufficient joint strength can be acquired only with the use of a glass sealing material without using an activated brazing material is provided. A crystal device includes an element loading member, lid member, a crystal vibration element, and a glass sealing material. The glass sealing material is provided in a ring-like form between the fringe of the lid member on a main surface side and the fringe of the element loading member on a main surface side, and keeps a space in vacuum.

4 Claims, 7 Drawing Sheets

(56) References Cited

U.S. PATENT DOCUMENTS

| | | | |
|---|---|---|---|
| 2004/0232592 A1* | 11/2004 | Hsu | B29C 39/10 264/259 |
| 2005/0195049 A1* | 9/2005 | Huang | H03H 3/0077 333/186 |
| 2007/0172991 A1* | 7/2007 | Schaadt | B81C 1/00269 438/123 |
| 2007/0289768 A1* | 12/2007 | Moore | G02F 1/13334 174/98 |
| 2007/0295456 A1* | 12/2007 | Gudeman | B81C 1/00269 156/379.7 |
| 2009/0322221 A1* | 12/2009 | Makansi | F25B 21/00 313/523 |
| 2010/0025722 A1* | 2/2010 | Wada | H01L 33/486 257/99 |
| 2010/0087024 A1* | 4/2010 | Hawat | B81B 7/0077 438/51 |
| 2010/0308928 A1* | 12/2010 | Aratake | H03H 9/1021 331/116 R |
| 2011/0203084 A1* | 8/2011 | Funabiki | G04F 5/063 29/25.35 |
| 2011/0227173 A1* | 9/2011 | Seppala | B81C 1/0023 257/415 |
| 2011/0234329 A1* | 9/2011 | Fukuda | H03H 9/1021 331/156 |
| 2011/0279023 A1* | 11/2011 | Nishioka | H01L 27/3253 313/504 |
| 2011/0303347 A1* | 12/2011 | Mizusawa | H03H 9/0595 156/89.12 |
| 2012/0206211 A1* | 8/2012 | Kobayashi | G04R 20/10 331/158 |
| 2012/0206999 A1* | 8/2012 | Aratake | G04R 20/10 368/47 |
| 2012/0235257 A1* | 9/2012 | Yoshida | G01L 1/106 257/418 |
| 2013/0082376 A1* | 4/2013 | Nagarkar | B81B 3/0081 257/698 |
| 2013/0128109 A1* | 5/2013 | Ichiki | H01L 27/14618 348/374 |
| 2013/0186945 A1* | 7/2013 | Miyao | H05K 13/04 228/221 |
| 2013/0214646 A1* | 8/2013 | Kojo | H01L 41/0533 310/344 |
| 2013/0276544 A1* | 10/2013 | Potasek | B81B 7/0048 73/715 |
| 2013/0294017 A1* | 11/2013 | Ota | G02F 1/1333 361/679.01 |
| 2014/0361410 A1* | 12/2014 | Yamamichi | H01L 23/49838 257/621 |
| 2016/0120051 A1* | 4/2016 | Kamakura | H05K 5/0239 361/807 |

* cited by examiner

○:SEALING OK/UNCRYSTALLIZED
△:SEALING OK/TEND TO BE CRYSTALLIZED
×:SEALING NG/CRYSTALLIZED

↓ HEATING TIME 30 [min]

| HEATING TEMPERATURE [°C]→ <br> ↓ VACUUM DEGREE [Pa] | 300 | 330 | 360 |
|---|---|---|---|
| $1.01 \times 10^5$ | ○ | ○ | ○ |
| 1 | ○ | △ | × |
| < 0.01 | △ | × | × |

FIG. 6B

↓ HEATING TEMPERATURE 330 [°C]

| HEATING TIME [min]→ <br> VACUUM DEGREE [Pa] ↓ | 1 | 2 | 3 | 5 | 10 | 20 | 40 |
|---|---|---|---|---|---|---|---|
| $1.01 \times 10^5$ | ○ | ○ | ○ | ○ | ○ | ○ | ○ |
| 1 | ○ | ○ | ○ | ○ | ○ | △ | × |
| < 0.01 | ○ | ○ | ○ | △ | × | × | × |

FIG. 7

ELECTRONIC DEVICE AND GLASS SEALING METHOD USED THEREFOR

CROSS-REFERENCE TO RELATED APPLICATION

This application is based upon and claims the benefit of priority from Japanese patent application No. 2013-034464, filed on Feb. 25, 2013, and No. 2013-102485, filed on May 14, 2013, the disclosure of which is incorporated herein in its entirety by reference.

BACKGROUND OF THE INVENTION

1. Field of the Invention

The present invention relates to an electronic device having a structure in which an electronic component element is housed within a space formed by an element loading member and a lid member, and to a glass sealing method used when manufacturing the electronic device.

2. Description of the Related Art

In general, an electronic device is used for an electronic apparatus. Particularly, a crystal device as an example of the electronic device is used often for the electronic apparatus such as a mobile communication apparatus. For example, JP No. 3811423 (Patent Document 1) discloses a crystal device in which an element loading member and a lid member are joined by a glass sealing material, and a crystal vibration element as an electronic component element is housed within the space.

Figure 7:
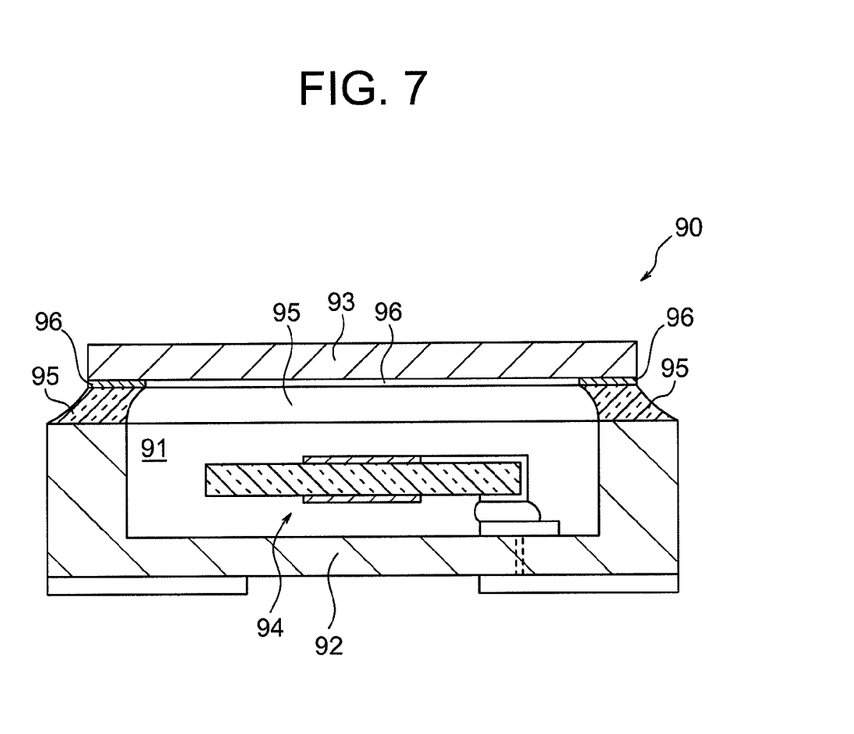
FIG. 7 is a sectional view showing a crystal device according to a related technique.

A crystal device 90 of a related technique shown in FIG. 7 includes an element loading member 92, a lid member 93, a crystal vibration element 94, a glass sealing material 95, and an activated brazing material 96. The element loading member 92 and the lid member 93 are joined by the glass sealing material 95, and the crystal vibration element 94 is hermetically sealed inside a space 91 formed by the element loading member 92 and the lid member 93. The lid member 93 is formed with metal, and the element loading member 92 is formed with ceramics.

A glass sealing method used when manufacturing the crystal device 90 is as follows: metal plating is applied on the lid member 93; the activated brazing material 96 is applied thereon; the glass sealing material 95 is applied thereon further; the lid member 93 is superimposed on the element loading member 92 on which the crystal vibration element 94 is loaded; and the glass sealing material 95 is melted by applying heat in an atmospheric pressure atmosphere to join the lid member 93 and the element loading member 92. The reason for providing the activated brazing material 96 between the lid member 93 and the glass sealing material 95 is for improving the joint strength between the lid member 93 and the element loading member 92.

The activated brazing material 96 is formed on the lid member 93 by a method described below, for example. First, a paste-type brazing material containing one or more kinds of activated metals selected from titanium, zirconium, and hafnium is printed on the joint faces of the lid member 93 and the glass sealing material 95 in a thickness of about 70 µm by screen printing, calender rolling, or the like. Then, after drying the printed paste-type brazing material containing the active metal, it is heated for 60 minutes at a temperature of about 800° C. in a heat treatment furnace of a reduced atmosphere. Thereby, the activated brazing material 96 in a layer thickness of about 55 µm is formed. At that time, a hydride layer of the activated metal in a film thickness of about 3 µm is formed on the surface of the activated brazing material 96.

As described above, with the crystal device 90 of the related technique, it is necessary to provide the activated brazing material 96 between the lid member 93 and the glass sealing member 95 for having the sufficient joint strength between the lid member 93 and the element loading member 92. However, for forming the activated brazing material 96, not only the price of the raw materials thereof is high but also the exclusively-used screen printing equipment as well as the heat treatment furnace of a reduced atmosphere is required. In addition, a high-temperature and long-time heat treatment is required at about 800° C. for 60 minutes. Thus, the use of the activated brazing material 96 complicates the manufacturing steps and increases the manufacturing cost.

It is therefore an exemplary object of the present invention to provide an electronic device and a glass sealing method used therefor, with which a sufficient joint strength can be acquired only with the use of a glass sealing material without using an activated brazing material.

SUMMARY OF THE INVENTION

The electronic device according to the present invention includes: an element loading member which includes one and other main surfaces in an obverse and reverse relation, a loading pad provided on the one main surface side, and an external connection terminal which is electrically connected to the loading pad and provided on the other main surface side; a lid member which has one and other main surfaces in an obverse and reverse relation, the one main surface side being superimposed on the one main surface side of the element loading member, thereby forming a space with the element loading member; an electronic component element having a connection terminal connected to the loading pad electrically, the electronic component element being housed inside the space; and a glass sealing material which is provided in a ring-like form between a fringe of the lid member on the one main surface side and a fringe of the element loading member on the one main surface side, and keeps the space in vacuum.

The electronic device glass sealing method according to the present invention is a glass sealing method used when manufacturing the electronic device of the present invention, and the method includes: a sealing material forming step which forms the glass sealing material at least on one of the fringe of the lid member on the one main surface side or the fringe of the element loading member on the one main surface side; a lid member disposing step which houses the electronic component within the space through superimposing the one main surface side of the lid member on the one main surface side of the element loading member on which the electronic component element is loaded by sandwiching the glass sealing material therebetween; and a joining step which joins the element loading member and the lid member while keeping the space in vacuum through melting or softening the glass sealing material by heating the glass sealing material in vacuum and hardening the glass sealing material again.

With the electronic device and the glass sealing method used therefor, a sufficient joint strength between the lid member and the element loading member can be acquired only with the use of the glass sealing material without using the activated brazing material since the glass sealing material keeps the space formed between the lid member and the element loading member in vacuum so that an atmospheric pressure force for tightly fitting the lid member and the element loading member works. Therefore, the steps for forming the activated brazing material can be omitted, so that the manufacturing steps can be simplified and the manufacturing cost can be reduced as well.

BRIEF DESCRIPTION OF THE DRAWINGS

FIGS. 4A-4C show sectional views of a glass sealing method according to a second exemplary embodiment, in which

FIGS. 6A and 6B show charts showing the results acquired by investigating the sealing property and the crystallization regarding samples created by using low melting-point glass while changing the vacuum degree, the heating temperature, and the heating time, in which

DETAILED DESCRIPTION OF THE PREFERRED EMBODIMENTS

Hereinafter, modes for embodying the present invention (referred to as "exemplary embodiments" hereinafter) will be described by referring to the accompanying drawings. In the current Specifications and Drawings, same reference numerals are used for substantially same structural elements. The shapes in the drawings are illustrated in such a manner to be easily comprehended by those skilled in the art, so that the dimensions and ratios thereof are not necessarily consistent with the actual ones. Hereinafter, explanations will be provided by taking a crystal vibration element as an example of an electronic component element, and a crystal device as an example of an electronic device. Further, an embodiment of the electronic device according to the present invention is taken as "a crystal device of a first exemplary embodiment" and an embodiment of the electronic device glass sealing method according to the present invention is taken as "a glass sealing method according to a second exemplary embodiment" in the explanations.

Figure 1:
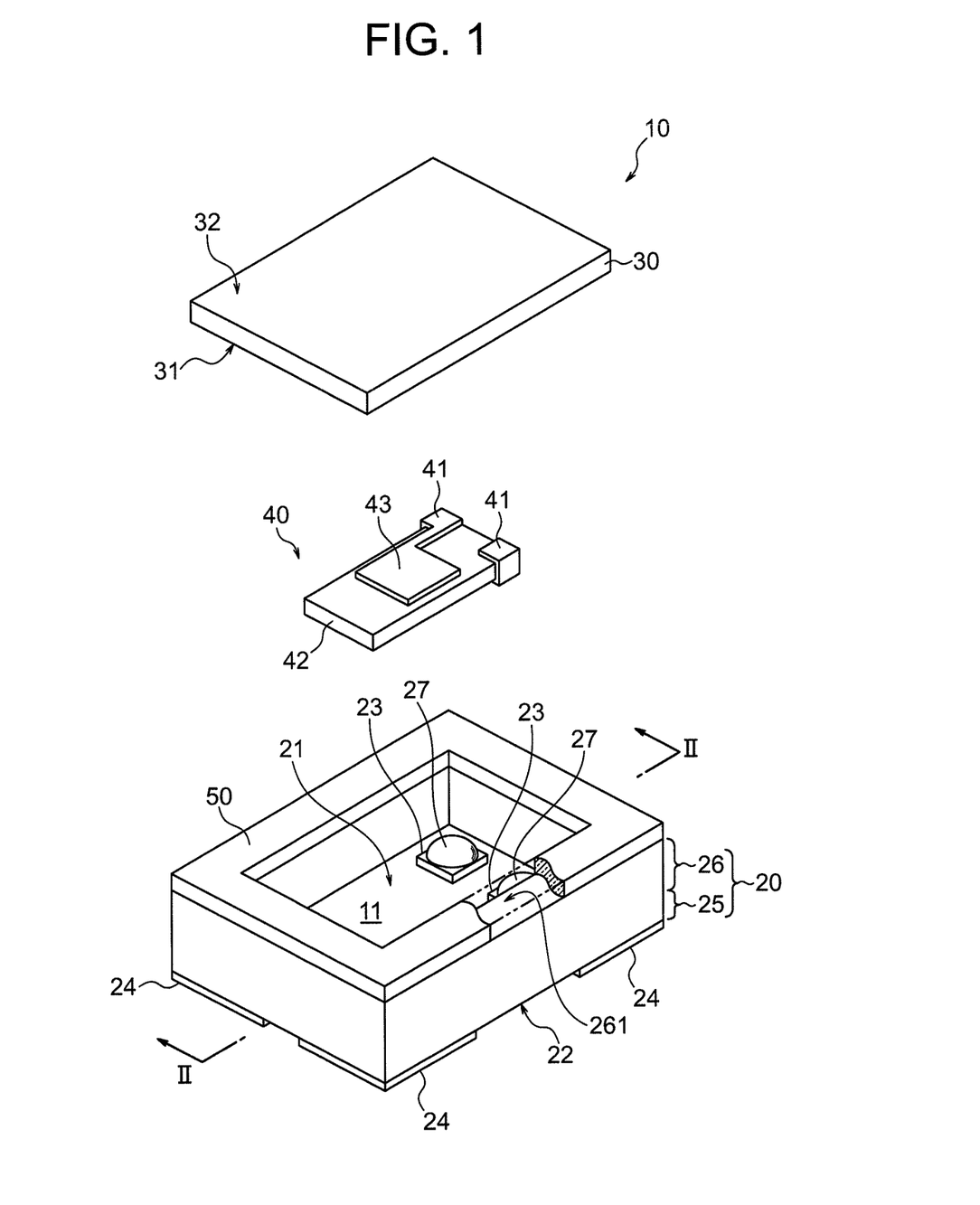
FIG. 1 is a detailed perspective view showing a crystal device according to a first exemplary embodiment.
Figure 2:
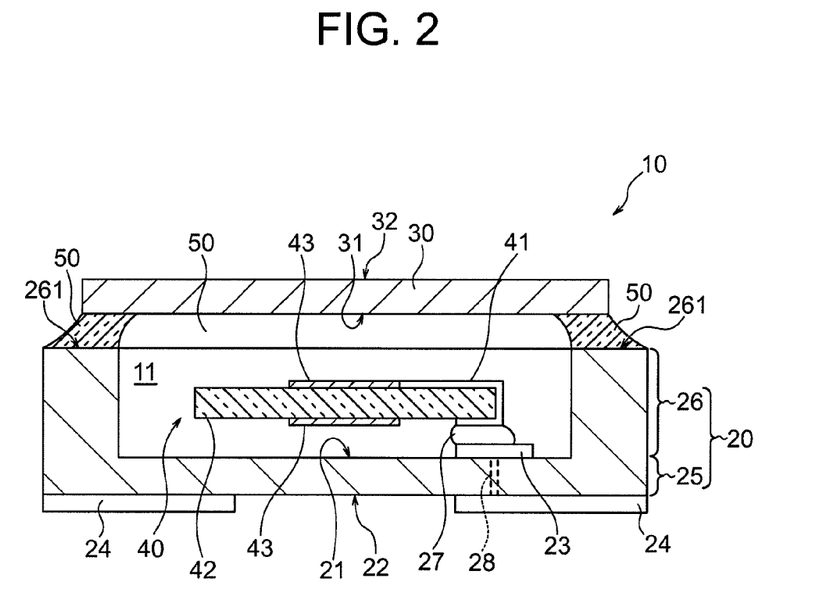
FIG. 2 is a sectional view taken along a line II-II of FIG. 1 which shows the crystal device according to the first exemplary embodiment.

FIG. 1 is a detailed perspective view showing the crystal device according to the first exemplary embodiment. FIG. 2 is a sectional view taken along a line II-II of FIG. 1 which shows the crystal device according to the first exemplary embodiment. Hereinafter, explanations will be provided by referring to those drawings.

FIG. 1 shows the state after executing a sealing material forming step and before executing an element loading step. FIG. 2 shows the state after executing a joining step. Each of those steps will be described later. First, the outline of a crystal device 10 according to the first exemplary embodiment will be described.

The crystal device 10 includes an element loading member 20, a lid member 30, a crystal vibration element 40, and a glass sealing material 50. The element loading ember 20 includes: a main surface 21 and the other main surface 22 that are in an obverse and reverse relation; a loading pad 23 provided on the one main surface 21 side; and an external connection terminal 24 which is electrically connected to the load pad 23 and provided on the other main surface 22 side. The lid member 30 includes a main surface 31 and the other main surface 32 in an obverse and reverse relation. The one main surface 31 side is superimposed on the other main surface 21 side of the element loading member 20, thereby forming a space 11 together with the element loading member 20. The crystal vibration element 40 includes a connection terminal 41 which is electrically connected to the loading pad 23, and it is housed inside the space 11. A glass sealing material 50 is provided in a ring-like form between the fringe of the main surface 31 side of the lid member 30 and the fringe of the other main surface side 21 of the element loading member 20, and keeps the inside of the space 11 in vacuum.

Next, the crystal device 10 of the first exemplary embodiment will be described in more details. The crystal device 10 is in a structure in which the element loading member 20 and the lid member 30 are joined by the glass sealing member 50 under a state where the crystal vibration element 40 is loaded on the element loading member 20, and the crystal vibration element 40 is hermetically sealed inside the space 11 formed by the element loading member 20 and the lid member 30.

The crystal vibration element 40 is constituted with a connection terminal 41, a crystal piece 42, and an excitation electrode 43. The excitation electrode 43 is provided on both main surfaces of the crystal piece 42, and the connection terminal 41 is provided by extended from the excitation electrode 43 to the end of the main surfaces of the crystal piece 42.

The lid member 30 is formed with metal such as 42 alloy, Kovar, or the like or formed with ceramics. The one main surface 31 and the other main surface 32 are formed in a rectangular flat plate form.

The element loading member 20 is formed with ceramics, for example, and includes a substrate part 25 and a frame part 26. The frame part 26 is provided in a ring-like form along the fringe of the substrate part 25 on the main surface 21 side. Further, in the element loading member 20, the loading pad 23 is provided on the main surface 21 side that is the base surface of the space 11, while the external connection terminal 24 is provided on the other main surface 22 side. The loading pad 23 is provided at the position opposing to the connection terminal 41 of the crystal vibration element 40, and it is electrically connected to the connection terminal 41 by a conductive adhesive material 27. The external connection terminal 24 is electrically connected to the loading pad 23 via an inside wiring 28 (FIG. 2) of the element loading member 20.

Therefore, the crystal vibration element 40 is loaded on the element loading member 20, the crystal vibration element 40 is housed inside the space 11, and the connection terminal 41 is electrically connected to the loading pad 23. The lid member 30 is formed in a flat plate form, and the element loading member 20 is formed in a structure having a recessed part. However, inversely, the lid member 30 may be formed in a structure having a recessed part, and the element loading member 20 may be formed in a flat plate form.

Further, the glass sealing material 50 is formed in a ring-like form along the fringe of the element loading member 20 on the one main surface 21 side. The fringe of the element loading member 20 on the one main surface 21 side is a top end surface 261 of the frame part 26. Thereby, the one main surface side 31 of the lid member 30 is joined by the glass sealing material 50 by being in contact with the one main surface 21 side of the element loading member 20. The glass sealing material 50 may also be formed in the lid member 30 instead of the element loading member 20 or along with the element loading member 20.

Further, the glass sealing material 50 formed in a ring-like form joins the lid member 30 and the element loading member 20 by being melted or softened and then hardened again. At this time, the crystal vibration element 40 loaded on the element loading member 20 is hermetically sealed within the space 11 formed by the lid member 30 and the element loading member 20.

The glass sealing material 50 is formed with a low melting point glass such as lead-oxide based glass or phosphate based glass. A case of using the glass sealing material 50 exhibits the excellent oxidation resistance and humid resistance compared to a case of using a metal sealing material.

Next, the working effect and efficiency of the crystal device 10 according to the first exemplary embodiment will be described.

(1) The glass sealing material 50 keeps the space 11 formed by the lid member 30 and the element loading member 20 in vacuum, so that an atmospheric pressure force for tightly fitting the lid member 30 and the element loading member 20 works. Thus, it is possible to acquire a sufficient joint strength between the lid member 30 and the element loading member 20 only with the use of the glass sealing material 50 without using an activated brazing material. Therefore, the step for forming the activated brazing material can be omitted, so that it is possible to simplify the manufacturing steps and to reduce the manufacturing cost as well. Note that "vacuum" herein is "a state of a space filled with a gas of a pressure lower than that of an atmospheric pressure" according to JIS (Japanese Industrial Standard).

(2) The degree of the vacuum within the space 11 is preferable to be between 30 Pa and 0.001 Pa, both inclusive. The reason for setting the vacuum degree within the space 11 as 30 Pa or less is to increase the difference with respect to the atmospheric pressure so as to acquire a more sufficient joint strength. The reason for setting the vacuum degree within the space 11 as 0.001 Pa or more is because it is possible to reach that vacuum degree with relatively simple equipment.

(3) In a case where the surface of the lid member in contact with the glass sealing material 50 is formed with an oxide layer, the glass sealing material 50 contains lead oxide, and the oxygen contained in the oxide layer and the lead contained in the glass sealing material 50 are chemically bonded at the face where the lid member 30 and the element loading member 20 are contacted, the joint strength between the lid member 30 and the element loading member 20 becomes more solid by the chemical bonding. Such chemical bonding can be acquired by a glass sealing method according to a second exemplary embodiment described later. Therefore, the lid member 30 may be formed with ceramics.

Figure 3A:
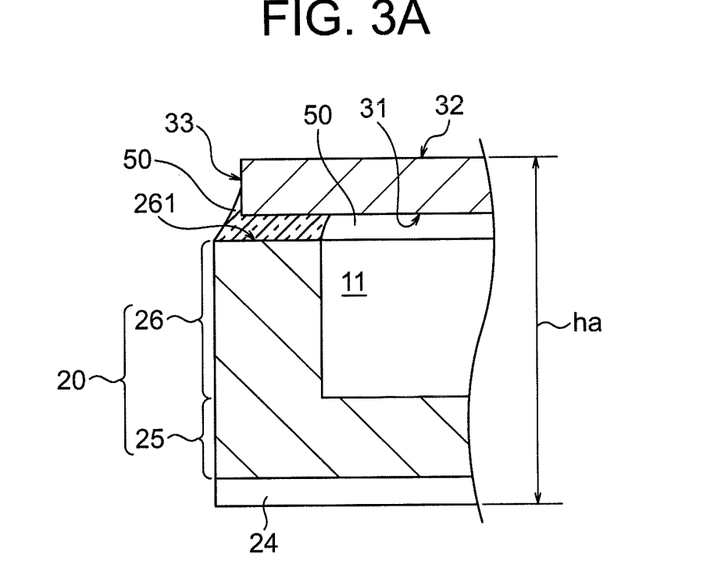
FIG. 3A is a fragmentary sectional view showing a modification example of the crystal device of the first exemplary embodiment.
Figure 3B:
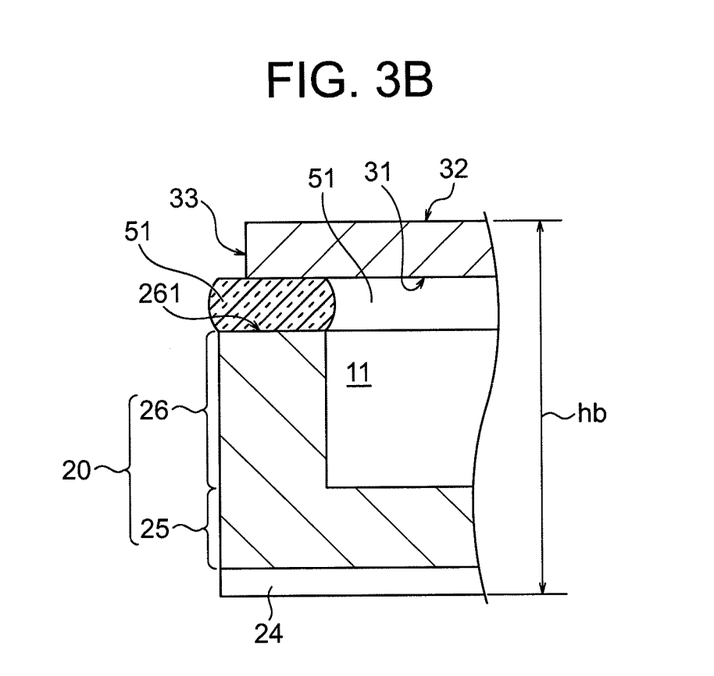
FIG. 3B is a fragmentary sectional view showing a comparative example thereof.

FIG. 3A is a fragmentary enlarged sectional view showing a modification example of the crystal device of the first exemplary embodiment, and FIG. 3B is a fragmentary enlarged sectional view showing a comparative example thereof. Hereinafter, explanations will be described by referring to FIG. 1 to FIG. 3.

The shapes of the lid member 30 and the element loading member 20 as the presupposition of the modification example will be described by referring to FIG. 1 and FIG. 2. The lid member 30 is formed in a flat and rectangular form. The element loading member 20 is constituted with the flat and rectangular substrate part 25 on which the loading pad 23 is provided and with the rectangular frame part 26 provided on the fringe of the substrate part 25 and the one main surface 21 side of the element loading member 20. The outer circumference of the rectangle of the frame part 26 is larger than the outer circumference of the rectangle of the lid member 30. The fringe of the element loading member 20 on the one main surface 21 side is the top end surface 261 of the frame part 26.

The feature of the modification example will be described by referring to FIG. 3A. The glass sealing material 50 is not extruded out to the outside from the top end surface 261 of the frame part 26. Further, the glass sealing material 50 is attached to a side surface 33 between the main surface 31 and the other main surface 32 of the lid member 30, and is attached from the side surface 33 to the top end surface 261 of the frame part 26 in a frit form. Such structure of the modification example can be acquired easily by the glass sealing method of the second exemplary embodiment described later. Other structures of the modification example are the same as those of the first exemplary embodiment described above.

A comparative example will be described by referring to FIG. 3B. A glass sealing material 51 is extruded to the outside of the top end surface 261 of the frame part 26. Further, the glass sealing material 51 is not attached to a side surface 33 between the one main surface 31 and the other main surface 32 of the lid member 30, so that it is not attached from the side surface 33 to the top end surface 261 of the frame part 26 in a fit form. Such structure of the comparative example can be acquired by sealing the glass in an atmospheric pressure atmosphere. Inside the space 11 of the comparative example is in an atmospheric pressure. Other structures of the comparative example are same as those of the modification example.

The working effect and efficiency of the modification example will be described by referring to FIGS. 3A and 3B.

(1) In the comparative example, the glass sealing material 51 is extruded out from the top end surface 261 to the outside. Thus, the extruded glass sealing material 51 abuts against a tray or the like used for transportation so that a crack is generated in the glass sealing material 51 in some cases. In the meantime, the glass sealing material 50 is not extruded to the outside in the modification example, so that it is possible to prevent generation of a crack in the glass sealing material 50 during transportation or the like. This makes it possible to improve the yield of the manufacture.

(2) In the comparative example, the glass sealing material 51 is not attached to the side surface 33, so that the glass sealing material 51 is not attached from the side surface 33 to the top end surface 261 in a frit form. In the meantime, in the modification example, the glass sealing material 50 is attached to the side surface 33, and the glass sealing material 50 is attached from the side surface 33 to the top end surface 261 in a frit form. Thus, the glass sealing material 50 is strongly attached to both surfaces of the side surface 33 of the lid member 30 and the one main surface 31, so that the joint strength between the lid member 30 and the element loading member 20 can be improved further.

(3) In the modification example, the glass sealing material 50 is attached to the side surface 33, and the glass sealing material 50 is attached from the side surface 33 to the top end surface 261 in a frit form. Thereby, the thickness of the glass sealing material 50 between the lid member 30 and the element loading member 20 becomes thinner compared to that of the comparative example. Thus, height ha of the device of the modification example becomes lower than the height hb of the device of the comparative example. Therefore, it is possible with the modification example to lower the height of the device, i.e., to reduce the size.

Figure 4A:
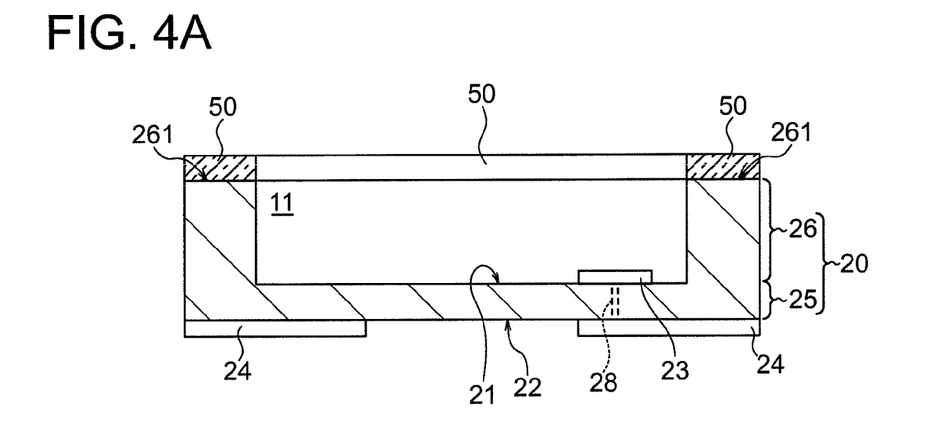
FIG. 4A shows a sealing material forming step.
Figure 4B:
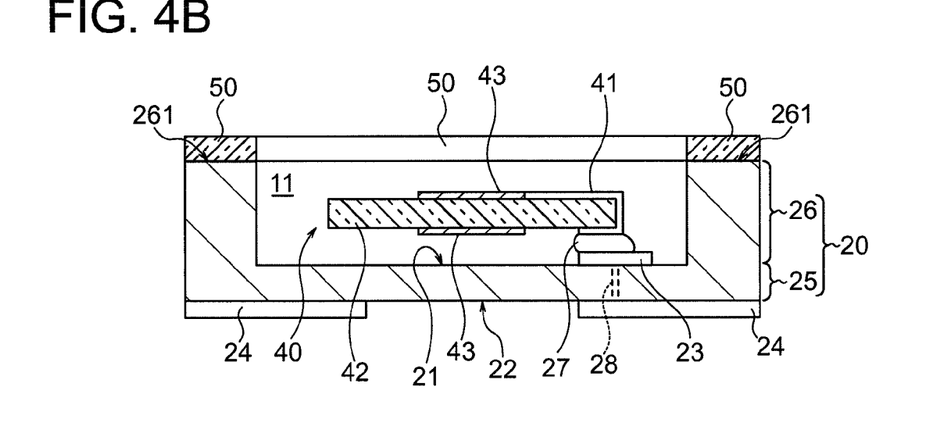
FIG. 4B shows an element loading step.
Figure 4C:
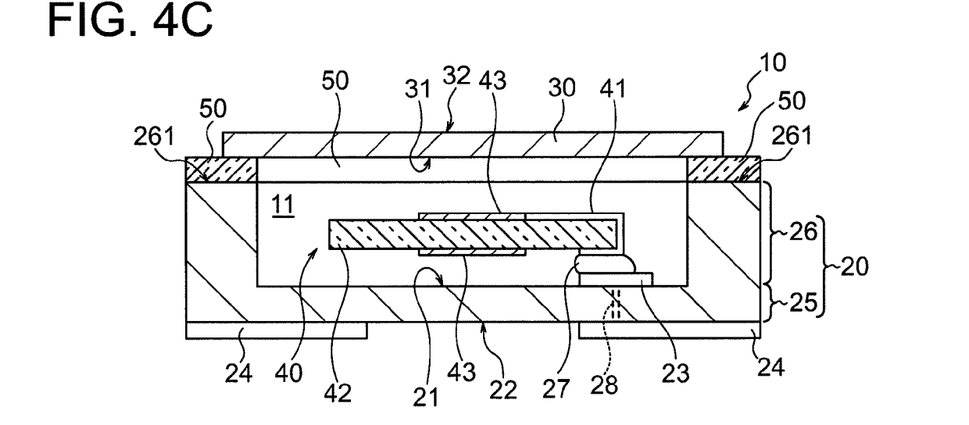
FIG. 4C shows a lid member disposing step.
Figure 5:
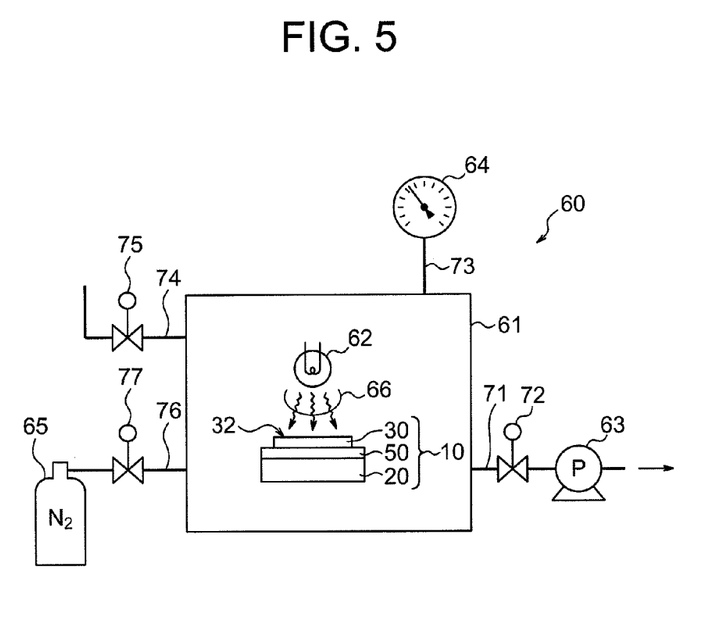
FIG. 5 is a schematic block diagram which shows a joining step of the glass sealing method according to the second exemplary embodiment.

FIG. 4 shows sectional views of the glass sealing method according to the second exemplary embodiment, in which FIG. 4A shows a sealing material forming step, FIG. 4B shows an element loading step, and FIG. 4C shows a lid member disposing step. FIG. 5 is a schematic block diagram which shows a joining step of the glass sealing method according to the second exemplary embodiment. Hereinafter, explanations will be provided by referring to those drawings.

The glass sealing method according to the second exemplary embodiment is a glass sealing method used when manufacturing the crystal device 10 of the first exemplary embodiment, which includes following steps.

A sealing material forming step (FIG. 4A) which forms the glass sealing material 50 at least in the fringe of the lid member 30 on the main surface 31 side or the fringe of the element loading member 20 on the main surface 21 side. In the second exemplary embodiment, the glass sealing material 50 is formed only on the element loading member 20.

A lid member disposing step (FIG. 4C) which houses, inside the space 11, the crystal vibration element 40 by superimposing the one main surface 31 side of the lid member 30 on the one main surface side 21 of the element loading member 20 on which the crystal vibration element 40 is loaded (FIG. 4B) by sandwiching the glass sealing material 50 therebetween. In the second exemplary embodiment, the one main surface 21 side of the element loading member 20 corresponds to the top end surface 261 of the frame part 26.

A joining step (FIG. 5) which joins the element loading member 20 and the lid member 30 while keeping the inside of the space 11 in vacuum by melting or softening the glass sealing material 50 through heating the glass sealing material 50 in vacuum and hardening the glass sealing material 50 again.

Next, a specific example of the glass sealing method according to the second exemplary embodiment will be described.

The vacuum degree in the joining step is between 30 Pa and 0.001 Pa, both inclusive. The lid member 30 is in a flat plate form. The element loading member 20 is constituted with the flat and rectangular substrate part 25 on which the loading pad 23 is provided and with the rectangular frame part 26 provided on the fringe of the substrate part 25 and the one main surface 21 side of the element loading member 20. In this case, in the joining step, the glass sealing material 50 is heated in vacuum by applying heat from the other main surface 32 side of the lid member 30 with infrared rays to melt or soften, the glass sealing material 50.

The joining step includes a step which changes the vacuum degree in vacuum to a higher pressure than earlier before hardening of the glass sealing material 50 is ended. "Higher pressure" herein includes a pressure of less than an atmospheric pressure, the atmospheric pressure, and a pressure exceeding the atmospheric pressure.

Next, each of the steps of the glass sealing method according to the second exemplary embodiment will be described in more details.

<Sealing Material Forming Step (FIG. 4A)>

The sealing material forming step is a step which forms the glass sealing material 50 in a ring-like form along the fringe of the one main surface 21 of the element loading member 20 on which the loading pad 23 is provided on the one main surface 21 side and the external connection terminal 24 electrically connected to the loading pad 23 is provided on the other main surface 22 side. In the second exemplary embodiment, the fringe of the one main surface 21 side is the top end surface 261 of the frame part 26. The glass sealing material 50 is formed by applying glass frit paste on the top end surface 261 of the frame part 26 by a screen printing method and then drying it, for example.

<Element Loading Step (FIG. 4B)>

The element loading step is a step which loads the crystal vibration element 40 on the element loading member 20 by electrically and mechanically connecting the connection terminal 41 of the crystal vibration element 40 to the loading pad 23 of the element loading member 20. In the element loading step, a conductive adhesive material 27 is applied on the loading pad 23 of the element loading member 20, the connection terminal 41 of the crystal vibration element 40 is brought into contact with the conductive adhesive material 27, and the conductive adhesive material 27 is hardened to electrically connect the loading pad 23 and the connection terminal 41. This element loading step is included in the steps of the manufacturing method of the crystal device. However, it is not necessarily included in the steps of the glass sealing method of the second exemplary embodiment, <Lid Member Disposing Step (FIG. 4C)>

The lid member disposing step is a step which disposes the lid member 30 to house the crystal vibration element 40 within the space 11 by bringing the one main surface 31 side of the lid member 30 to be in contact with the main surface 21 side of the element loading member 20, i.e., the top end surface 261 of the frame part 26.

<Joining Step (FIG. 5)>

FIG. 5 is a schematic block diagram showing an example of a vacuum heating device used in the joining step. The vacuum heating device 60 includes: a vacuum chamber 61; a halogen heater 62 as a heating source; a vacuum pump 63; a vacuum indicator 64; a purge gas supply source 65; and the like. The halogen heater 62 is housed in the vacuum chamber 61. The vacuum pump 63 is connected to the vacuum chamber 61 via a pipe 71 and a valve 72, the vacuum indicator 64 is connected via a pipe 73, an air release valve 75 is connected via a pipe 74, and the purge gas supply source 65 is connected via a pipe 76 and a valve 77.

Next, a detailed example of the joining step will be described by mainly referring to FIG. 5.

First, the crystal device 10 in which the lid member 30 is superimposed on the element loading member 20 by sandwiching the glass sealing material 50 (FIG. 4C) is placed inside the vacuum chamber 61. Subsequently, the valve 72 is closed and the valves 75, 77 are opened to replace the air inside the vacuum chamber 61 with a nitrogen gas. Then, the valves 75, 77 are closed and the valve 72 is opened, and the vacuum pump 63 is turned on to start to acquire a vacuum state. At this time, glass frit paste is applied and dried on the glass sealing material 50, so that a small gap is generated between the glass sealing material 50 and the lid member 30. A gas goes in and out from the gap, so that the vacuum degree within the chamber 61 and that of the space 11 (FIG. 4C) of the crystal device 10 become almost equivalent.

Then, when the vacuum degree indicated by the vacuum indicator 64 reaches 30 Pa or less, for example, heating is started by turning on the halogen heater 62. That is, the glass sealing material 50 is heated in vacuum through heating it from the other main surface 32 side of the lid member 30 with infrared rays 66 to melt or soften the glass sealing material 50. Subsequently, after a prescribed time has passed from the point where the halogen heater 62 is turned on, heating is ended by turning off the halogen heater 62. At this time, the vacuum degree within the vacuum chamber 61 may be changed to a higher pressure than earlier before hardening of the glass sealing material 50 is ended. Specifically, after a prescribed time has passed from the point where the halogen heater 62 is turned off, a nitrogen gas is inserted within the vacuum chamber 61 by opening the valve 77 or a nitrogen gas of an atmospheric pressure is filled inside the vacuum chamber 61 by opening the valves 75, 77. Further, it is also possible to fill the vacuum chamber 61 with a nitrogen gas that exceeds the atmospheric pressure by closing the valves 72, 75 and opening the valve 77. At last, the crystal device 10 (FIG. 2) in which the element loading member 20 and the lid member 30 are joined by the glass sealing material 50 is taken out from the vacuum chamber 61.

Next, the working effect and efficiency of the glass sealing method according to the second exemplary embodiment will be described.

(1) Through melting or softening the glass sealing material 50 by heating the glass sealing material 50 in vacuum and hardening the glass sealing material 50 again to join the element loading member 20 and the lid member 30 while keeping the inside of the space 11 in vacuum, the crystal device 10 in which the space 11 is kept in vacuum can be acquired. Thus, as described above, it is possible to acquire the sufficient joint strength between the lid member 30 and the element loading member 20 only with the use of the glass sealing material 50 without using an activated brazing material, so that the activated brazing material forming step can be omitted. This makes it possible to simplify the manufacturing steps and to reduce the manufacturing cost as well. While the activated brazing material forming step can be omitted with the second exemplary embodiment, the joining step becomes slightly complicated, e.g., the vacuum equipment is required. However, complication of the joining step is not a big issue compared to the simplification of the manufacturing steps achieved by omitting the activated brazing material forming step. Therefore, it is possible to simplify the manufacturing steps as a whole.

(2) When the vacuum degree in vacuum in the joining step is set to be between 30 Pa and 0.001 Pa, both inclusive, the vacuum degree within the space 11 can be set to be between 30 Pa and 0.001 Pa, both inclusive. Thus, as described above, it is possible to acquire the sufficient joint strength between the lid member 30 and the element loading member 20 with the relatively simple equipment.

(3) When the glass sealing material 50 is heated from the lid member 30 side, for example, in the joining step, the heat generated from the heating source transmits to the glass sealing material 50 via the lid member 30. With the related technique in such condition, the heat supplied to the lid member dissipates due to the transfer of the heat to the air into the atmospheric pressure atmosphere since the crystal device is heated in the atmospheric pressure atmosphere. For that, the lid member needs to be heated to a high temperature for heating the glass sealing material to a prescribed temperature. In the meantime, with the second exemplary embodiment, the crystal device 10 is heated in vacuum. Thus, the heat supplied to the lid member 30 hardly dissipates in vacuum, and most of it transmits to the glass sealing material 50 via the lid member 30. That is, with the second exemplary embodiment, the difference between the temperatures of the lid member 30 and the glass sealing material 50 in the joining step is small, so that the thermal stress can be eased. Therefore, damages generated in the manufacturing steps can be reduced, which makes it possible to improve the joint strength between the lid member 30 and the element loading member 20 further.

(4) When the vacuum degree in vacuum is changed to a higher voltage than earlier before hardening of the glass sealing material 50 is ended in the joining step, the glass sealing material 50 is melted or softened and atmospheric pressure of the outside of the vacuum 11 becomes higher while the inside the space 11 is kept as airtight. Thereby, a force works for tightly fitting the lid member 30 and the element loading member 20. As a result, the melted or softened glass sealing material 50 is forced to expand, so that the attached area of the glass sealing material 50 is increased. Thereby, the joint strength between the lid member 30 and the element loading member 20 can be improved further.

(5) When the vacuum degree in vacuum is changed to a higher voltage than earlier before hardening of the glass sealing material 50 is ended in the joining step, the structure shown in FIG. 3A can be acquired through adjusting the vacuum degree when changing the vacuum degree to a higher pressure. That is, through adjusting the vacuum degree at the time of changing the vacuum degree to a higher pressure, a force for pressing in the glass sealing material 50 into the inside of the space 11 works sufficiently. Thus, it is possible to acquire the structure (FIG. 3A) in which the glass sealing material 50 is not extruded out from the top end surface 261 of the frame part 26. Further, when a force for tightly fitting the lid member 30 and the element loading member 20 is applied in a degree of more than a specific amount, the state shown in FIG. 2 is changed to the state shown in FIG. 3A, for example. That is, through adjusting the vacuum degree at the time of changing the vacuum degree to a higher pressure, it is possible to acquire the structure (FIG. 3A) in which the glass sealing material 50 is attached to the side surface 33 of the lid member 30 and the glass sealing material 50 is attached from the side surface 33 to the top end surface 261 of the frame part 26 in a frit form.

(6) When the vacuum degree in vacuum is changed to a higher voltage than earlier before hardening of the glass sealing material 50 is ended in the joining step, voids generated in the glass sealing material 50 can be removed through adjusting the vacuum degree when changing the vacuum degree to a higher pressure. When the glass sealing material 50 is heated/melted/softened in vacuum in the joining step, a little amount of gas remained within the space 11 (FIG. 4C) of the crystal device 10 enters inside the melted and softened glass sealing material 50 and tries to goes outside in an air babble form. When it is cooled in vacuum under such state, the air bubbles remain as the voids in the hardened glass sealing material 50. The voids are the factors for decreasing the joint strength. Thus, through applying a high pressure before hardening of the glass sealing material 50 is ended, the voids are removed. It is desirable that the "higher pressure" is an atmospheric pressure, since a sufficient pressure can be acquired, the operation is easy, and the effect of rapid cooling can be expected as well. The "effect by rapid cooling" is that it is possible to suppress intrusion of the air bubbles to the glass sealing material 50 promptly since the glass sealing material 50 is hardened rapidly because the glass sealing material 50 is cooled rapidly by the gas of the atmospheric pressure. The temperature profile of rapid cooling is 100° C./min, for example.

(7) Through setting the vacuum degree in vacuum and the temperature as well as the time of heating to be within the ranges with which crystallization of the glass sealing material 50 does not occur when heating the glass sealing material 50 in vacuum in the joining step, it is possible to prevent deterioration of the strength of the glass sealing material 50 due to crystallization of the glass sealing material 50.

Figure 6A:
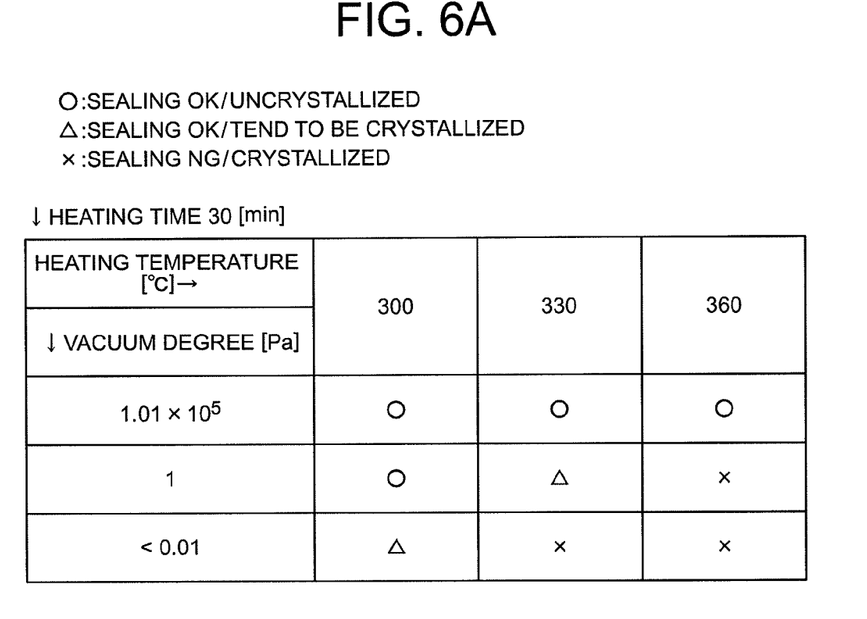
FIG. 6A shows a case where the heating time is fixed and FIG. 6B shows a case where the heating temperature is fixed.
Figure 6B:
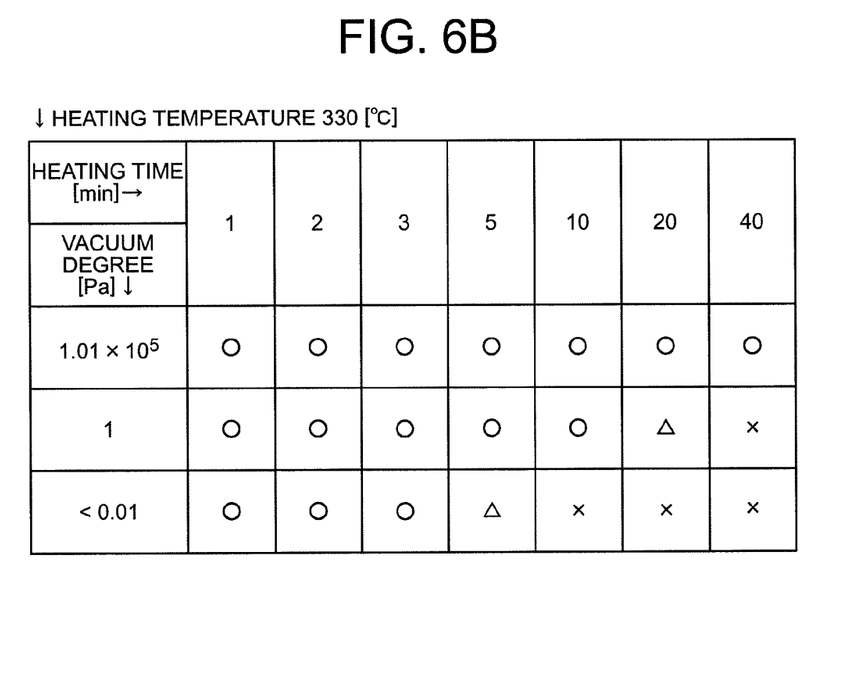

Detailed explanations will be provided by referring to FIG. 6. FIG. 6 provides charts showing the result acquired by investigating "sealing property and crystallization" regarding the samples created by using low melting point glass while changing "vacuum degree, heating time and temperature". FIG. 6A is a case where the heating time is fixed as 30 min, and FIG. 6B is a case where the heating temperature is fixed at 330° C. When the joint strength of the created samples is equal to or more than the allowable value, it is defined that sealing is OK. When the joint strength is less than the allowable value, it is defined that sealing is NG. The composition of the low melting point glass used in this case is as follows except for the filler used for adjusting the thermal expansion coefficient. That is, 55 wt % of lead oxide (PbO), 18 wt % of lead fluoride (PbF$_2$), 6 wt % of titanium dioxide (TiO$_2$), 4 wt % of niobium oxide (Nb$_2$O$_5$), 5 wt % of bismuth oxide (Bi$_2$O$_3$), 3 wt % of boron oxide (B$_2$O$_3$), 3 wt % of zinc oxide (ZnO), 3 wt % of ferric oxide (Fe$_2$O$_3$), 2 wt % of cuprous oxide (CuO), and 1 wt % of calcium oxide (CaO). The sealing recommended temperature of this low melting point glass is 320° C.

As can be seen from the result, the low melting point glass is easily crystallized when the vacuum degree is higher, the heating temperature is higher, and the heating time is longer, respectively. The reason thereof is considered that the oxygen in the low melting point glass is more diffused in the gas phase when the vacuum degree is higher, the heating temperature is higher, and the heating time is longer, so that the chemical composition of the low melting point glass changes to be easily crystallized. When the low melting point glass was crystallized, that part became fragile and the joint strength was deteriorated.

In order to acquire the sufficient joint strength by increasing the difference with respect to the atmospheric pressure as described above, it is desirable for the vacuum degree to be as high as possible. In the meantime, as shown in FIG. 6, as the vacuum degree is increased higher, the glass sealing material 50 becomes crystallized and the joint strength is decreased thereby. For example, in a case where the heating temperature is set as 330° C., the glass sealing material 50 is crystallized in 20 minutes or longer in the vacuum degree of 1 Pa and crystallized in 5 minutes or longer in the vacuum degree of 0.01 Pa or less. Thus, considering the sealing property, it is desirable to set the vacuum degree as 0.01 Pa or less and the heating time as 1 to 5 minutes (more desirably, 1 minute) in the case where the heating temperature is set as 330° C.

(8) In a case where the surface of the lid member 30 in contact with the glass sealing material 50 is formed with an oxide layer and the glass sealing material 50 contains lead oxide, oxygen contained in the oxide layer and lead contained in the glass sealing material 50 are chemically bonded in the joining step in the surfaces where the lid member 30 and the glass sealing material 50 come to be in contact with each other. Thus, the joint strength between the lid member 30 and the element loading member 20 can be made still stronger by the chemical bonding. For example, when the lid member 30 is formed with 42 alloy having a nickel plated layer on the surface thereof, a nickel oxide layer is naturally formed on the surface of the nickel plated layer with the oxygen in the air. In the meantime, lead oxide is contained in the glass sealing material 50 formed with the typical low melting point glass. It is considered that the reason the lead oxide gives the low melting point property to the glass is that Pb—O bonding is weaker and easily dissociated than Si—O bonding of silicate, and that an unshared electron pair exists on the lead atom and the electrons rebel against each other, thereby intervening formation of a network. In association with such characteristic of the lead oxide, it is considered that the lead oxide is dissociated to oxygen and lead, and the lead is joined to oxygen of the nickel oxide layer, when the glass sealing material 50 is heated in vacuum. When the glass sealing material 50 is heated in the air, oxygen is supplied from the air even when the lead oxide is dissociated to oxygen and lead. Thus, the lead is not bonded to the oxygen of the nickel oxide layer. Further, when the glass sealing material 50 is heated in a reduced atmosphere, the oxide such as the lead oxide contained in the glass sealing material 50 is reduced. Therefore, the chemical composition of the glass sealing material 50 changes, so that the strength is decreased.

Next, the results acquired by conducting tensile tests on the crystal device 10 acquired by the second exemplary embodiment shown in FIG. 2 and a crystal device 90 of a related technique shown in FIG. 7 will be described.

The test method is as follows. First, ten each of the crystal devices 10 and 90 are prepared. Then, a ring-type copper wire is soldered to the entire exposed main surfaces of the respective lid members 30 and 93. Subsequently, a push-pull gage hook is hitched to the ring-type copper wire, and the ring-type wire is pulled at 5 mm/min until the lid members 30 and 93 come off while pressing the element loading members 20 and 92.

The test results are as follows. The average value of the rapture points of the crystal device 90 according to the related technique was 6.4 N. The average value of the rapture points of the crystal device 90 according to the related technique was 17.2 N. That is, with the second exemplary embodiment, the rapture strength of about three times stronger than that of the related technique could be acquired even though the activated brazing material was not used. Further, glass frit was attached to all the raptured lid members 30 of the second exemplary embodiment. This shows that it is not detachment generated in the interface between the glass sealing material 50 and the lid member 30 but it is bulk destruction of the glass sealing material 50. This means that a sufficient joint strength between the glass sealing material 50 and the lid member 30 can be acquired without using the activated brazing material.

While the present invention has been described above by referring to each of the exemplary embodiments, the present invention is not limited only to each of the exemplary embodiments described above. Regarding the structures and details of the present invention, various changes and modifications occurred to those skilled in the art can be applied. For example, as the electronic component elements, it is possible to use a piezoelectric vibration element constituted with ceramics, a capacitor element, a semiconductor element, and the like. The electronic device may be designed to house a plurality of electronic component elements. Further, the present invention includes the structures acquired by properly and mutually combining a part of or a whole part of the structures of each of the above-described embodiments.

What is claimed is:
1. A glass sealing method used when manufacturing an electronic device, the electronic device including:
an element loading member which includes one and other main surfaces in an obverse and reverse relation, a loading pad provided on the one main surface side, and an external connection terminal which is electrically connected to the loading pad and provided on the other main surface side;

a lid member which has one and other main surfaces in an obverse and reverse relation, the one main surface side being superimposed on the one main surface side of the element loading member, thereby forming a space with the element loading member;

an electronic component element having a connection terminal connected to the loading pad electrically, the electronic component element being housed inside the space; and a glass sealing material which is provided in a ring-like form between a fringe of the lid member on the one main surface side and a fringe of the element loading member on the one main surface side, and keeps the space in vacuum; and the method comprising:

a sealing material forming, which forms the glass sealing material at least on one of the fringe of the lid member on the one main surface side or the fringe of the element loading member on the one main surface side;

a lid member disposing, which houses the electronic component within the space through superimposing the one main surface side of the lid member on the one main surface side of the element loading member on which the electronic component element is loaded by sandwiching the glass sealing material therebetween; and a joining, which joins the element loading member and the lid member while keeping the space in vacuum through melting or softening the glass sealing material by heating the glass sealing material in vacuum and hardening the glass sealing material again;

wherein the joining includes changing the vacuum degree in the vacuum to a higher voltage during the hardening.

2. A glass sealing method used when manufacturing an electronic device, the electronic device including:

an element loading member which includes one and other main surfaces in an obverse and reverse relation, a loading pad provided on the one main surface side, and an external connection terminal which is electrically connected to the loading pad and provided on the other main surface side;

a lid member which has one and other main surfaces in an obverse and reverse relation, the one main surface side being superimposed on the one main surface side of the element loading member, thereby forming a space with the element loading member;

an electronic component element having a connection terminal connected to the loading pad electrically, the electronic component element being housed inside the space; and a glass sealing material which is provided in a ring-like form between a fringe of the lid member on the one main surface side and a fringe of the element loading member on the one main surface side, and keeps the space in vacuum; and the method comprising:

a sealing material forming, which forms the glass sealing material at least on one of the fringe of the lid member on the one main surface side or the fringe of the element loading member on the one main surface side;

a lid member disposing, which houses the electronic component within the space through superimposing the one main surface side of the lid member on the one main surface side of the element loading member on which the electronic component element is loaded by sandwiching the glass sealing material therebetween; and a joining, which joins the element loading member and the lid member while keeping the space in vacuum through melting or softening the glass sealing material by heating the glass sealing material in vacuum and hardening the glass sealing material again;

wherein:

the lid member is in a flat and rectangular shape;

the element loading member is formed with a flat and rectangular substrate part on which the loading pad is provided and with a rectangular frame part provided on a fringe of the substrate part and on the one main surface side of the element loading member;

outer circumference of the rectangle of the frame part is larger than outer circumference of the rectangle of the lid member;

the fringe of the element loading member on the one main surface side is a top end surface of the frame part; and in the joining, the vacuum degree in the vacuum is changed to a higher voltage during the hardening to press in the glass sealing material so as not to be extruded to outside from the top end surface of the frame part.

3. A glass sealing method used when manufacturing an electronic device, the electronic device including:

an element loading member which includes one and other main surfaces in an obverse and reverse relation, a loading pad provided on the one main surface side, and an external connection terminal which is electrically connected to the loading pad and provided on the other main surface side;

a lid member which has one and other main surfaces in an obverse and reverse relation, the one main surface side being superimposed on the one main surface side of the element loading member, thereby forming a space with the element loading member;

an electronic component element having a connection terminal connected to the loading pad electrically, the electronic component element being housed inside the space; and a glass sealing material which is provided in a ring-like form between a fringe of the lid member on the one main surface side and a fringe of the element loading member on the one main surface side, and keeps the space in vacuum; and the method comprising:

a sealing material forming, which forms the glass sealing material at least on one of the fringe of the lid member on the one main surface side or the fringe of the element loading member on the one main surface side;

a lid member disposing, which houses the electronic component within the space through superimposing the one main surface side of the lid member on the one main surface side of the element loading member on which the electronic component element is loaded by sandwiching the glass sealing material therebetween; and a joining, which joins the element loading member and the lid member while keeping the space in vacuum through melting or softening the glass sealing material by heating the glass sealing material in vacuum and hardening the glass sealing material again;

wherein:

the lid member is in a flat and rectangular shape;

the element loading member is formed with a flat and rectangular substrate part on which the loading pad is provided and with a rectangular frame part provided on a fringe of the substrate part and on the one main surface side of the element loading member;

outer circumference of the rectangle of the frame part is larger than outer circumference of the rectangle of the lid member;

the fringe of the element loading member on the one main surface side is a top end surface of the frame part; and in the joining, the vacuum degree in the vacuum is changed to a higher voltage during the hardening to attach the glass sealing material to a side surface between the one main surface and the other main surface of the lid member and to attach the glass sealing material from the side surface to the top end surface of the frame part.

4. A glass sealing method used when manufacturing an electronic device, the electronic device including:

an element loading member which includes one and other main surfaces in an obverse and reverse relation, a loading pad provided on the one main surface side, and an external connection terminal which is electrically connected to the loading pad and provided on the other main surface side;

a lid member which has one and other main surfaces in an obverse and reverse relation, the one main surface side being superimposed on the one main surface side of the element loading member, thereby forming a space with the element loading member;

an electronic component element having a connection terminal connected to the loading pad electrically, the electronic component element being housed inside the space; and a glass sealing material which is provided in a ring-like form between a fringe of the lid member on the one main surface side and a fringe of the element loading member on the one main surface side, and keeps the space in vacuum; and the method comprising:

a sealing material forming, which forms the glass sealing material at least on one of the fringe of the lid member on the one main surface side or the fringe of the element loading member on the one main surface side;

a lid member disposing, which houses the electronic component within the space through superimposing the one main surface side of the lid member on the one main surface side of the element loading member on which the electronic component element is loaded by sandwiching the glass sealing material therebetween; and a joining, which joins the element loading member and the lid member while keeping the space in vacuum through melting or softening the glass sealing material by heating the glass sealing material in vacuum and hardening the glass sealing material again;

wherein in the joining, the vacuum degree in the vacuum is changed to a higher voltage during the hardening to remove a void generated in the glass sealing material.

* * * * *